United States Patent
Chen

(10) Patent No.: US 10,283,175 B1
(45) Date of Patent: May 7, 2019

(54) NAND FLASH MEMORY AND STATUS OUTPUT METHOD IN NAND FLASH MEMORY

(71) Applicant: SHINE BRIGHT TECHNOLOGY LIMITED, Hongkong (CN)

(72) Inventor: Minyi Chen, San Jose, CA (US)

(73) Assignees: GIGADEVICE SEMICONDUCTOR (SHANGHAI) INC., Shanghai (CN); GIGADEVICE SEMICONDUCTOR (BEIJING) INC., Beijing (CN); GIGADEVICE SEMICONDUCTOR (HEFEI) INC., Hefei (CN)

( * ) Notice: Subject to any disclaimer, the term of this patent is extended or adjusted under 35 U.S.C. 154(b) by 0 days.

(21) Appl. No.: 15/853,841

(22) Filed: Dec. 24, 2017

(51) Int. Cl.
  *G11C 7/10* (2006.01)
  *G11C 16/32* (2006.01)
  *G11C 7/22* (2006.01)

(52) U.S. Cl.
  CPC .......... *G11C 7/1063* (2013.01); *G11C 7/1057* (2013.01); *G11C 7/1096* (2013.01); *G11C 7/222* (2013.01); *G11C 16/32* (2013.01)

(58) Field of Classification Search
  CPC ..... G11C 7/1063; G11C 7/1096; G11C 7/222; G11C 7/1057; G11C 16/32
  See application file for complete search history.

(56) References Cited

U.S. PATENT DOCUMENTS

| | | | | |
|---|---|---|---|---|
| 2007/0109857 | A1* | 5/2007 | Kojima | G06F 11/1068 365/185.11 |
| 2011/0219171 | A1* | 9/2011 | Kuehne | G06F 12/00 711/103 |
| 2013/0119542 | A1* | 5/2013 | Oh | H01L 25/0657 257/738 |
| 2016/0365127 | A1* | 12/2016 | Chun | G11C 5/148 |

* cited by examiner

*Primary Examiner* — Ajay Ojha
(74) *Attorney, Agent, or Firm* — Gokalp Byramoglu

(57) ABSTRACT

The present application provides a status output method in NAND flash memory, including, setting ALE signal, CLE signal and WE#, signal wherein ALE and/or CLE signal is set to be 1 and WE# signal is set to be 1; when a falling edge of the RE# is detected, outputting LUN status signal of the NAND flash memory. Further, there is provided a NAND flash memory, including I/O signal pins, which includes an ALE signal pin, an CLE signal pin, a WE# signal pin, and a RE# signal pin; wherein when the ALE signal output by the ALE pin and/or CLE signal output by the CLE pin is 1, and WE# signal output by the WE# pin is 1, once a falling edge of the RE# is detected, the LUN status signal of the NAND flash memory is detected.

5 Claims, 4 Drawing Sheets

| RE# | ALE | CLE | WE# | WP# | function |
|---|---|---|---|---|---|
| 1 | 0 | 0 | 1 | 0 | write protect |
| 1 | 1 | 0 | 0 | 1 | address input |
| 1 | 0 | 1 | 0 | 1 | command input |
| 0 | 0 | 0 | 1 | 1 | read output |
| 0 | 1 | 1 | 1 | 1 | read output (status) |
| 0 | 1 | 0 | 1 | 1 | read output (status) |
| 0 | 0 | 1 | 1 | 1 | read output (status) | function is same as CMD_70

NAND FLASH MEMORY AND STATUS OUTPUT METHOD IN NAND FLASH MEMORY

TECHNICAL FIELD

The present application generally relates to the NAND flash memory technical field and, more particularly, to a NAND flash memory and a status output method in NAND flash memory.

BACKGROUND OF THE INVENTION

Flash memory is an electronic (solid-state) non-volatile computer storage medium that can be electrically erased and reprogrammed. The NAND flash memory is a main type of flash memory named after the NAND logic gates, it has advantages of fast programming and short erasing time.

In order to communicate with an external control device (such as a computer), an interface of the NAND flash memory is needed. The interface in NAND flash memory mainly comprises seven control signals except for I/O bus:
1, CE# (Chip Enable), if there is no CE signal is detected, NAND flash memory will stay in a standby mode without responding to any control signal.
2, WE# (Write Enable), it writes the data, address or command to the NAND flash memory.
3, RE# (Read Enable), it provides a buffer for output data.
4, CLE (Command Latch Enable), in the case of CLE is in high level, when a rising edge of WE# is detected, command is latched in a NAND command register.
5, ALE (Address Latch Enable), in the case of ALE is in high level, when a rising edge of WE# is detected, address is latched in a NAND address register.
6, R/B# (Ready/Busy), if NAND flash memory is busy, the R/B# is toggled to low level, a pull-up resistor is needed.
7, WP#: Write Protect)—prevent unexpected command write operation.

In the conventional technology, as shown in FIG. 1, if it is required to output current status of a NAND flash memory, a controller of the NAND flash memory needs to perform the following processes:
1, in the first clock cycle, in the situation of ALE signal to be 0, the CLE signal is toggled to be 1, such as in time t1 of FIG. 1.
2, the WE# signal is toggled to be 0 by the NAND controller in time t2 of FIG. 1, and at the same time the read status command 70h is issued via the I/O bus.
3, in the second clock cycle, the RE# signal is toggled to be 0 in time t3 of FIG. 1, as long as the falling edge of the RE# is detected, a status signal is issued via the I/O bus. The external controller such as the computer may obtain the status of NAND flash memory via the I/O bus.

According to the above processes, if the external controller needs to know the current status of the NAND flash memory, a data (0×70) should be write in the NAND flash memory, therefore the WE# signal should be set to 0 in advance to write the data in. After writing the data in, the WE# signal is set to 1 to close the data receiving channel. The read status command 70h is defined by ONFI standard, which is not illustrated herein for concise.

In the conventional technology, the two-clock-cycle waiting time is needed once the external controller needs to know the status, which consumes time and lowers the system performance. As a person skilled in the art can understand, acquiring the status of the NAND flash memory is very often used in operating the NAND flash memory, the command of acquiring the status signal is needed each time after other commands such as programming or erasing are sent. Therefore the speed for waiting for status signal should be improved.

SUMMARY OF THE INVENTION

As an improvement, there is provided a NAND flash memory and a status output method in NAND flash memory, which may overcome or at least partially solve or mitigate above problems.

According to an aspect of the present application, there is provided a status output method in NAND flash memory, comprising:
setting ALE signal, CLE signal and WE#, signal wherein ALE signal and/or CLE signal is set to be 1 and WE# signal is set to be 1;
when a falling edge of the RE# is detected, outputting LUN status signal of the NAND flash memory.

In an embodiment of the present application, the method further comprises:
when the ALE signal and/or CLE signal is detected to be 1, storing LUN status signal in a storage area of the NAND flash memory.

In an embodiment of the present application, the storage area is a register.

The application further discloses a NAND flash memory, comprising:
I/O signal pins, which includes an ALE signal pin, an CLE signal pin, a WE# signal pin, and a RE# signal pin;
wherein when the ALE signal output by the ALE pin and/or CLE signal output by the CLE pin is 1, and WE# signal output by the WE# pin is 1, once a falling edge of the RE# is detected, the LUN status signal of the NAND flash memory is detected.

In an embodiment of the present application, the NAND flash memory further comprises a storage for storing LUN status signal of the NAND flash memory.

In an embodiment of the present application, the storage is a register.

In an embodiment of the present application, the NAND flash memory is a multi-die package NAND flash memory.

In the application, there is provided a NAND flash memory and a status output method thereof, in which the status is output faster than that in the conventional technology and the system performance is improved, and the speed for waiting for status signal should be improved.

The above description is merely an overview of technical solutions of the present application. In order to more clearly understand the technical solutions of the present application to implement in accordance with the contents of the description, and to make the foregoing and other objects, features and advantages of the application more apparent, detailed embodiments of the application will be provided below.

BRIEF DESCRIPTION OF THE DRAWINGS

Through reading the detailed description of the following preferred embodiments, various other advantages and benefits will become apparent to those of ordinary skills in the art. Accompanying drawings are merely included for the purpose of illustrating the preferred embodiments and should not be considered as limiting of the application. Further, throughout the drawings, like elements are indicated by like reference numbers.

DETAILED DESCRIPTION OF THE INVENTION

Exemplary embodiments of the present application will be described in detail with reference to the accompanying drawings hereinafter.

Figure 1:
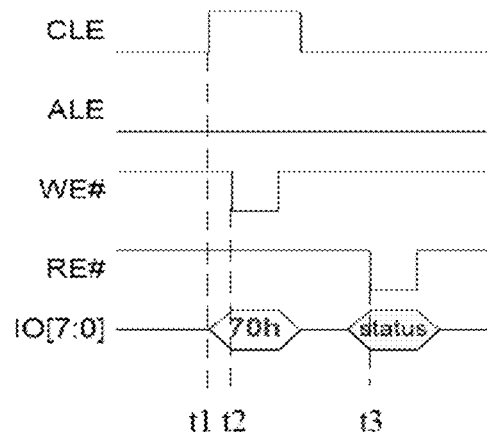
FIG. 1 is a schematic diagram showing the control signals for obtaining the status of the NAND flash memory in the prior art.
Figure 2:
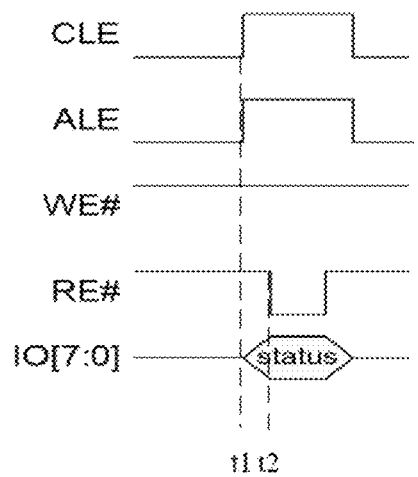
FIG. 2 is a schematic diagram showing the control signals for obtaining the status of the NAND flash memory according to an embodiment of the present application.

As shown in FIG. 2, it is a schematic diagram showing the control signals for obtaining the status of the NAND flash memory according to an embodiment of the present application. As shown in FIG. 2, in time t1, the ALE signal and CLE signal are set to be 1, which means command latch is enabled and address latch is enabled, the current status of NAND flash memory may be written in storage area of the NAND flash memory such as register. Then, in time t2, the RE# signal is toggled to be 0, which means read is enabled, and the NAND flash memory can read data from I/O bus. When the NAND flash memory detects the toggle of RE# in time t2, it obtains the current status from the storage area such as register, and output the current status via the I/O bus.

Figure 3:
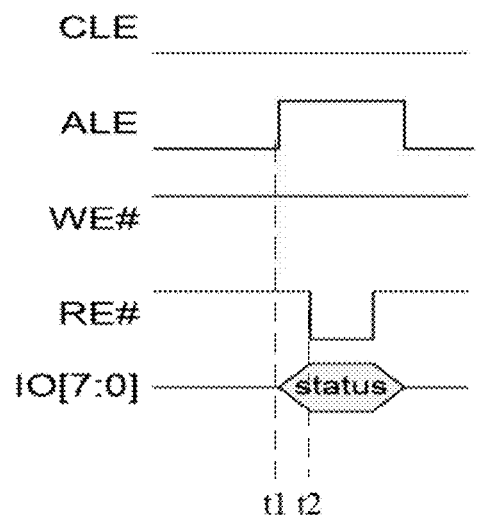
FIG. 3 is a schematic diagram showing the control signals for obtaining the status of the NAND flash memory according to another embodiment of the present application.

As shown in FIG. 3, it is a schematic diagram showing the control signals for obtaining the status of the NAND flash memory according to another embodiment of the present application. As shown in FIG. 3, in time t1, the ALE signal is set to be 1, which means address latch is enabled, the current status of NAND flash memory may be written in storage area of the NAND flash memory such as register. Then, in time t2, the RE# signal is toggled to be 0, which means read is enabled, and the NAND flash memory can read data from I/O bus. When the NAND flash memory detects the toggle of RE# in time t2, it obtains the current status from the storage area such as register, and output the current status via the I/O bus.

Figure 4:
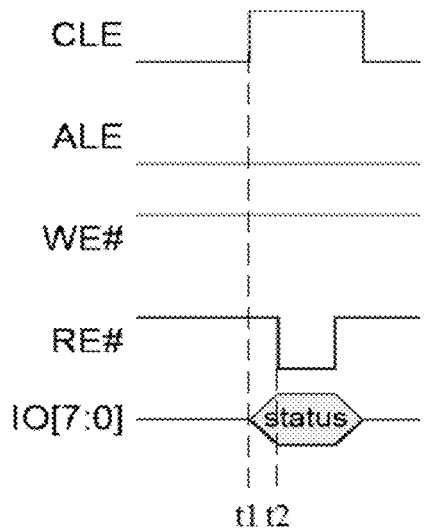
FIG. 4 is a schematic diagram showing the control signals for obtaining the status of the NAND flash memory according to still another embodiment of the present application.

As shown in FIG. 4, it is a schematic diagram showing the control signals for obtaining the status of the NAND flash memory according to still another embodiment of the present application. As shown in FIG. 4, in time t1, the CLE signal is set to be 1, which means command latch is enabled, the current status of NAND flash memory may be written in storage area of the NAND flash memory such as register. Then, in time t2, the RE# signal is toggled to be 0, which means read is enabled, and the NAND flash memory can read data from I/O bus. When the NAND flash memory detects the toggle of RE# in time t2, it obtains the current status from the storage area such as register, and output the current status via the I/O bus.

Figures 5, 6:
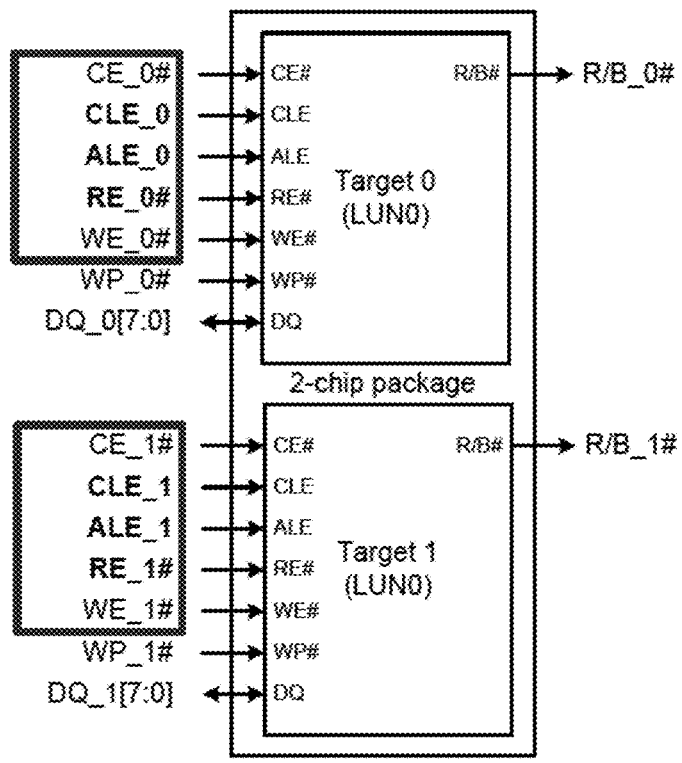
FIG. 5 is a chart showing the signal level of each control signal and the corresponding functions.
FIG. 6 is a schematic diagram showing the method for obtaining the status of each chip in the multi-chip package according to an embodiment of the present application.

FIG. 5 is a chart showing the signal level of each control signal and the corresponding functions. As shown in last three lines of the chart in FIG. 5:

when the RE# signal is 0, ALE signal is 1, CLE signal is 1, WE# signal is 1, WP# signal is 1, the corresponding function is read output, the current status can be output;

when the RE# signal is 0, ALE signal is 1, CLE signal is 0, WE# signal is 1, WP# signal is 1, the corresponding function is read output, the current status can be output;

when the RE# signal is 0, ALE signal is 0, CLE signal is 1, WE# signal is 1, WP# signal is 1, the corresponding function is read output, the current status can be output.

As shown in FIG. 6, the application is also adapted to a multi-die package. As each flash memory (also called "chip" or "die") in the package has independent control signals, the output status of each die is also independent. In the embodiment in FIG. 6, with respect to the Target 0 and Target 1, the output R/B_0# and R/B_1# are independent. A skilled person in the art may change the number of dies according to different situations, which may be 4 dies, 8 dies, 16 dies, and the application is not limited thereto.

Figure 7:
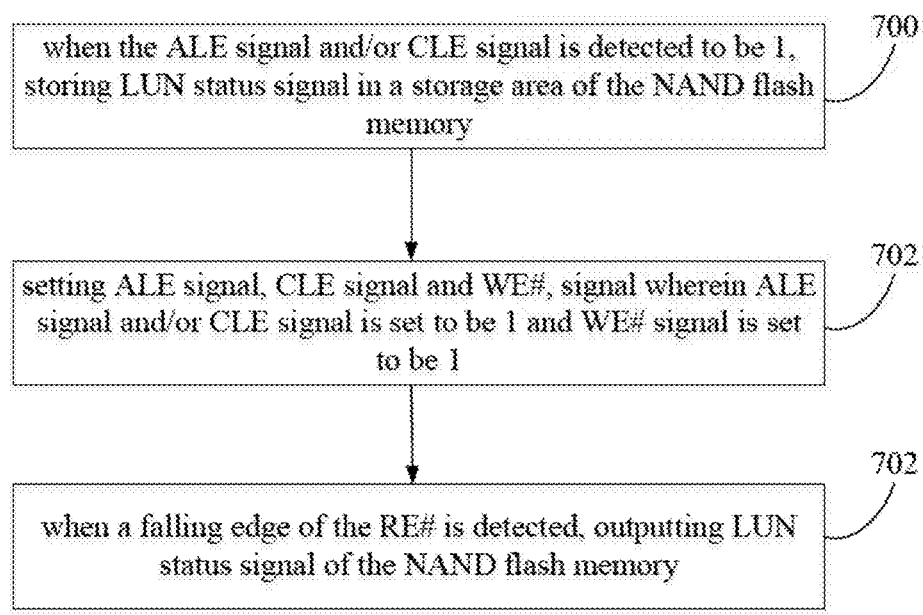
FIG. 7 is a flow chart showing the method for obtaining the status of the present application.

As shown in FIG. 7, it is a flow chart showing the status output method for NAND flash memory according to an embodiment of the present application, in FIG. 7, the method may include steps as follows:

S701, setting ALE signal, CLE signal and WE#, signal wherein ALE signal and/or CLE signal is set to be 1 and WE# signal is set to be 1;

S702, when a falling edge of the RE# is detected, outputting LUN status signal of the NAND flash memory.

In an embodiment, prior to the step S701, the method may further include the following step:

S700, when the ALE signal and/or CLE signal is detected to be 1, storing LUN status signal in a storage area of the NAND flash memory. The storage area may be a register.

The application further discloses a NAND flash memory, comprising:

I/O signal pins, which includes an ALE signal pin, an CLE signal pin, a WE# signal pin, and a RE# signal pin:

wherein when the ALE signal output by the ALE pin and/or CLE signal output by the CLE pin is 1, and WE# signal output by the WE# pin is 1, once a falling edge of the RE# is detected, the LUN status signal of the NAND flash memory is detected.

In an embodiment of the present application, the NAND flash memory further comprises a storage for storing LUN status signal of the NAND flash memory.

In an embodiment of the present application, the storage is a register.

In an embodiment, the NAND flash memory is a multi-die package NAND flash memory.

The "an embodiment", "embodiments" or "one or more embodiments" mentioned in the disclosure means that the specific features, structures or performances described in combination with the embodiment(s) would be included in at least one embodiment of the present application. Moreover, it should be noted that, the wording "in an embodiment" herein may not necessarily refer to the same embodiment.

Many details are discussed in the specification provided herein. However, it should be understood that the embodiments of the disclosure may be implemented without these specific details. In some examples, the well-known methods, structures and technologies are not shown in detail so as to avoid an unclear understanding of the description.

In the application, there is provided a status output method and NAND flash memory thereof, in which the status is output faster than that in the conventional technology and the system performance is improved, and the speed for waiting for status signal should be improved.

It should be noted that the above-described embodiments are intended to illustrate but not to limit the present application, and alternative embodiments may be devised by the person skilled in the art without departing from the scope of claims as appended. In the claims, any reference symbols between brackets form no limit of the claims. The wording "include" does not exclude the presence of elements or steps not listed in a claim. The wording "a" or "an" in front of an element does not exclude the presence of a plurality of such elements. The disclosure may be realized by means of hardware comprising a number of different components and by means of a suitably programmed computer. In the unit claim listing a plurality of devices, some of these devices may be embodied in the same hardware. The wordings "first", "second", and "third", etc. do not denote any order. These wordings may be interpreted as a name.

Also, it should be noticed that the language used in the present specification is chosen for the purpose of readability and teaching, rather than explaining or defining the subject matter of the present application. Therefore, it is obvious for an ordinary skilled person in the art that modifications and variations could be made without departing from the scope and spirit of the claims as appended. For the scope of the present application, the publication of the inventive disclosure is illustrative rather than restrictive, and the scope of the present application is defined by the appended claims.

What is claimed is:

1. A status output method in NAND flash memory, comprising:
    setting an address latch enable (ALE) signal, a command latch enable (CLE) signal and a write enable (WE#) signal, wherein the address latch enable (ALE) signal and/or the command latch enable (CLE) signal is set to be 1 and the write enable (WE#) signal is set to be 1;
    when a falling edge of a read enable (RE#) is detected, outputting a logic unit (LUN) status signal of the NAND flash memory;
    wherein,
    when the address latch enable (ALE) signal and/or the command latch enable (CLE) signal is detected to be 1, storing the logic unit (LUN) status signal in a storage area of the NAND flash memory.

2. The status output method according to claim 1, wherein the storage area is a register.

3. A NAND flash memory, comprising:
    I/O signal pins, including an address latch enable (ALE) pin, a command latch enable (CLE) pin, a write enable (WE#) pin, and a read enable (RE#) pin;
    wherein when an ALE signal outputted by the address latch enable (ALE) pin and/or a CLE signal outputted by the command latch enable (CLE) pin is 1, and a WE# signal outputted by the write enable (WE#) pin is 1, once a falling edge of the read enable (RE#) pin is detected, a logic unit (LUN) status signal of the NAND flash memory is detected;
    wherein the NAND flash memory further comprises a storage for storing the logic unit (LUN) status signal of the NAND flash memory.

4. The NAND flash memory according to claim 3, wherein the storage is a register.

5. The NAND flash memory according to claim 3, wherein the NAND flash memory is a multi-die package NAND flash memory.

* * * * *